(12) United States Patent
Boecker (10) Patent No.: US 8,274,326 B2
(45) Date of Patent: Sep. 25, 2012

(54) EQUALIZATION CIRCUIT

(75) Inventor: Charles W. Boecker, Ames, IA (US)

(73) Assignee: MoSys, Inc., Santa Clara, CA (US)

( * ) Notice: Subject to any disclaimer, the term of this patent is extended or adjusted under 35 U.S.C. 154(b) by 51 days.

(21) Appl. No.: 12/872,852

(22) Filed: Aug. 31, 2010

(65) Prior Publication Data

US 2012/0049946 A1 Mar. 1, 2012

(51) Int. Cl.
  H03F 1/14 (2006.01)
  H03F 1/34 (2006.01)
  H03F 3/18 (2006.01)
  H04B 7/005 (2006.01)

(52) U.S. Cl. ........ 327/559; 327/563; 330/253; 330/258; 330/261

(58) Field of Classification Search .................. None
See application file for complete search history.

(56) References Cited

U.S. PATENT DOCUMENTS

| | | | |
|---|---|---|---|
| 6,259,300 B1 * | 7/2001 | Yasuda et al. ................ | 327/333 |
| 6,753,730 B2 * | 6/2004 | Yamamoto ................... | 330/253 |
| 6,882,224 B1 | 4/2005 | Gaboury et al. | |
| 7,227,409 B2 * | 6/2007 | Chung ........................... | 330/69 |
| 7,271,623 B2 * | 9/2007 | Palmer .......................... | 327/52 |
| 2007/0229159 A1 * | 10/2007 | Krishnan et al. ............. | 330/253 |

* cited by examiner

*Primary Examiner* — Lincoln Donovan
*Assistant Examiner* — Terry L Englund
(74) *Attorney, Agent, or Firm* — Meyertons, Hood, Kivlin, Kowert, & Goetzel, P.C.

(57) ABSTRACT

An equalization circuit includes a first differential amplifier having first and second transistors, and a first differential high-pass filter coupled to respective gate terminals of the first and second transistors. A source terminal of the first transistor is coupled to a first input node, and a source terminal of the second transistor is coupled to the second input node. The equalization circuit further includes a second differential amplifier having third and fourth transistors, and a second differential high-pass filter coupled to respective gate terminals of each of the third and fourth transistors. A source terminal of the third transistor is coupled to the first input node, and a source terminal of the second transistor is coupled to the second input node. Using such a circuit, continuous time decision feedback equalization may be performed.

24 Claims, 6 Drawing Sheets

EQUALIZATION CIRCUIT

BACKGROUND

1. Field of the Invention

This invention relates to electronic circuits, and more particularly, to equalization circuits.

2. Description of the Related Art

In modern electronic systems, signals may be transmitted over signal lines between or within integrated circuits (ICs). When transmitting between two ICs, signals may be conveyed on signal lines of a printed circuit board (PCB), via a cable, or by other means. Signals may also traverse relatively long distances within an IC over signal lines implemented on the IC die. When signals are conveyed between a source and a destination, some of the signal power may be lost. Accordingly, signals received at a destination may be provided to circuitry designed to prevent a loss of signal power.

Ensuring that signals are received at the destination with maximum or optimal signal power may include controlling a frequency response. Accordingly, receiver circuits may be implemented with equalization circuitry intended to provide a desired response across a range of frequencies. One type of commonly used circuit for performing equalization is a passive filter. A passive filter is implemented using passive components (e.g., resistors and capacitors), but not with active components (e.g., transistors). A passive filter may be implemented as a low-pass filter, a high-pass filter, or a band pass filter. A low-pass filter allows the passage of signals in a frequency range from 0 Hz up to a maximum frequency. A high-pass filter allows the passage of signals that are above a minimum frequency. A band pass filter allows the passage of signals between a minimum and a maximum frequency. Thus, using such filtering circuitry, passive equalization of circuitry may be performed on received signals.

SUMMARY OF THE DISCLOSURE

Embodiments of an equalization circuit are disclosed. In one embodiment, the equalization circuit includes a first differential amplifier having first and second transistors, and a first differential high-pass filter coupled to respective gate terminals of the first and second transistors. A source terminal of the first transistor is coupled to a first input node, and a source terminal of the second transistor is coupled to the second input node. The equalization circuit further includes a second differential amplifier having third and fourth transistors, and a second differential high-pass filter coupled to respective gate terminals of each of the third and fourth transistors. A source terminal of the third transistor is coupled to the first input node, and a source terminal of the second transistor is coupled to the second input node.

In one embodiment, a method includes receiving a first signal at both a source terminal of a first transistor of a first differential amplifier and at a source terminal of a third transistor of a second differential amplifier. The method further includes receiving a second signal at both a source terminal of a second transistor of the first differential amplifier and at a source terminal of a fourth transistor of the second differential amplifier. High-pass filtering of the first signal is performed in first and second differential high-pass filters, wherein filtered versions of the first signal are received at respective gate terminals of the second and fourth transistors. The first and second differential high-pass filters also perform filtering of the second signal, wherein filtered versions of the second signal are received at respective gate terminals of the first and third transistors. The method further includes amplifying, in each of the first and second amplifiers, a difference between filtered versions of the first and second signals.

A method for performing continuous time decision feedback equalization is also disclosed. In one embodiment, such a method includes receiving first and second input signals and amplifying, in first and second differential amplifiers, a difference between filtered versions of the first and second signals. The method may further include generating, based on said amplifying, a differential output having first and second full-rail digital output signals on first and second output paths, respectively. The method further contemplates providing the first full-rail digital output signal as continuous time feedback to an input of the second output path and providing the second output signal as continuous time feedback to an input of the first output path.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the invention, including as defined by the appended claims.

DETAILED DESCRIPTION

Figure 1A:
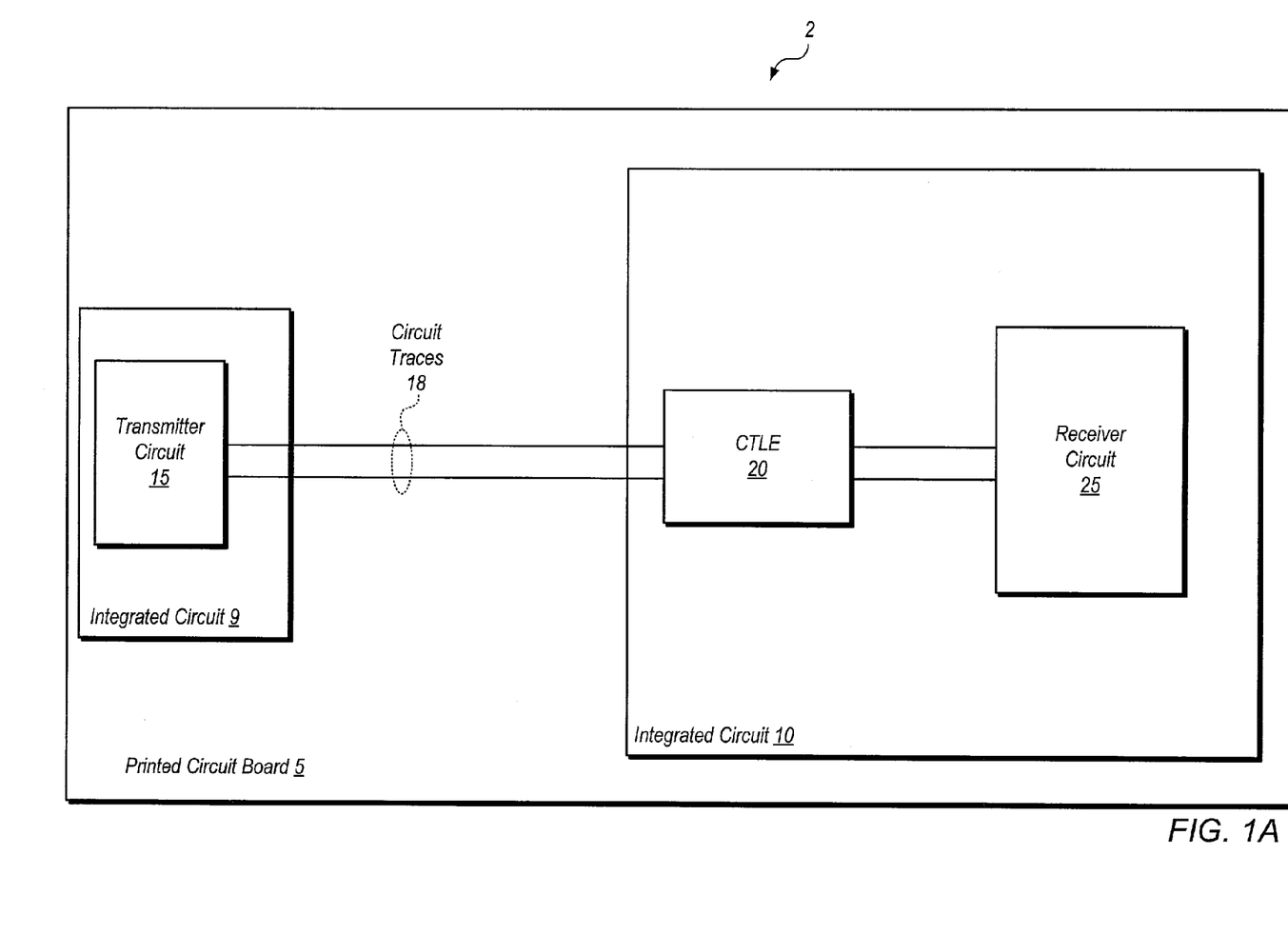
FIG. 1A is a block diagram of one embodiment of a printed circuit assembly.

Printed Circuit Assembly and Integrated Circuit Embodiments:

Turning now to FIG. 1A, a block diagram of one embodiment of a printed circuit assembly (PCA) is shown. In the embodiment shown, PCA 2 includes at least one transmitter circuit 15 and at least one receiver circuit 25. Transmitter circuit 15 may be part of an integrated circuit (IC) 9 mounted on PCB 5. Similarly, receiver circuit 25 may be a part of an IC 10 mounted on a printed circuit board (PCB) 5. In practice PCB 5 may have multiple ICs mounted thereupon, and each IC may include a number of different types of circuitry, including transmitters, receivers, digital logic circuits, analog circuits, and so forth. The limited number of functional units on PCB 5 and within ICs 9 and 10 shown herein are for illustrative purposes, although it is to be understood that PCAs and ICs having various levels of complexity may be implemented, each of which may incorporate the circuitry to be discussed in further detail below.

In the embodiment shown, circuit traces 18 and continuous time linear equalizer (CTLE) 20 form a communication channel between transmitter circuit 15 and receiver circuit 25. Information may be transmitted across the channel, from transmitter to receiver, as a differential signal. During the transmission of differential signals, some signal loss may be experienced due to frequency-dependent attenuation. These losses may adversely affect the performance of the communication channel. However, CTLE 20 may equalize the channel over a predetermined frequency range, thereby compensating for at least some of the frequency dependent losses. CTLE 20 may be configured according to the required frequency response of the communication channel. A more detailed description of embodiments of CTLE 20 will be presented below.

Figure 1B:
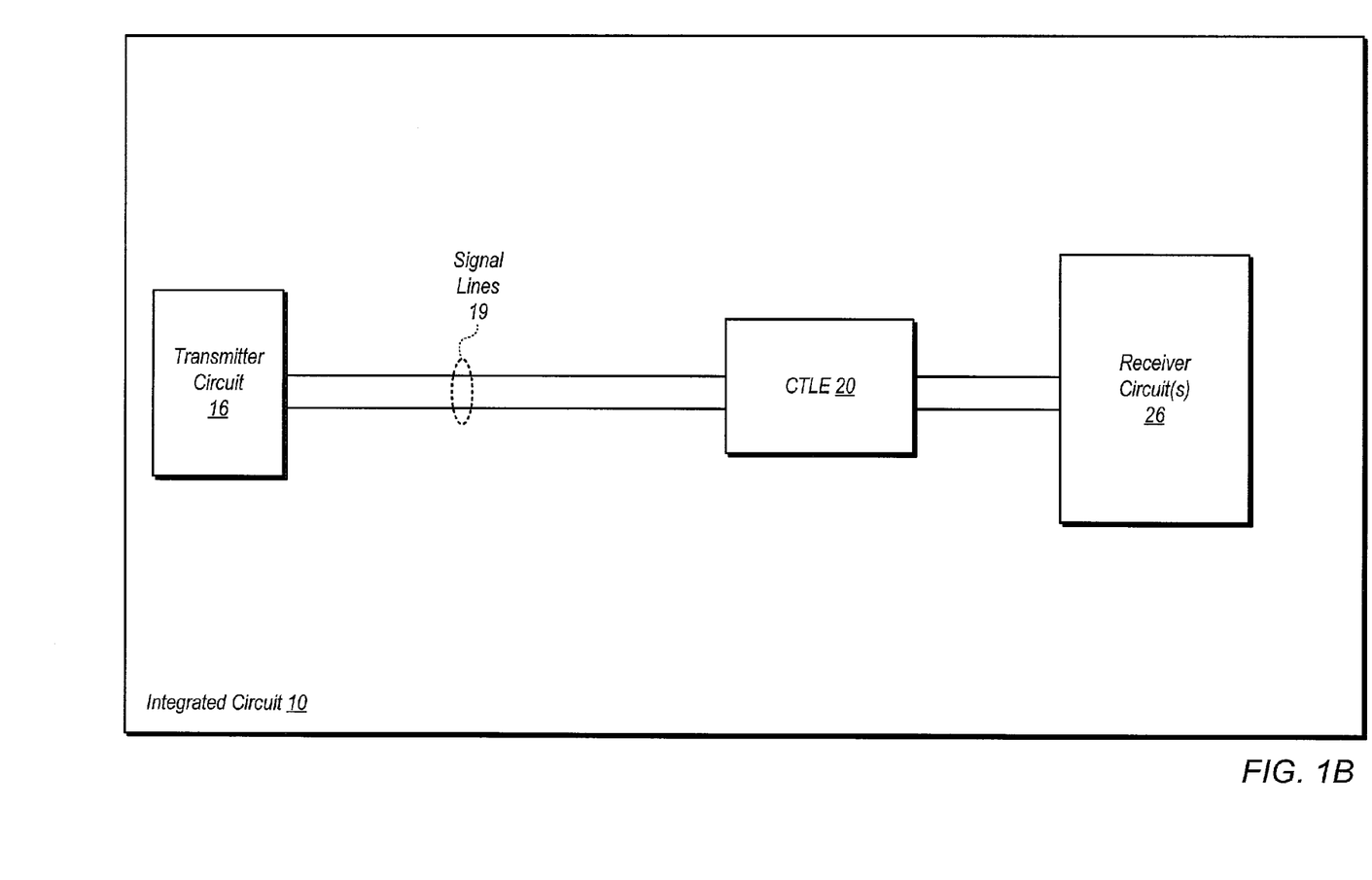
FIG. 1B is a block diagram of one embodiment of an integrated circuit.

A similar arrangement is shown in FIG. 1B. More particularly, FIG. 1B illustrates an embodiment of IC 10 having a transmitter circuit 16, a receiver circuit 26, CTLE 20, and signal lines 19. Similar to the embodiment shown in FIG. 1A, CTLE 20 may compensate for some signal attenuation losses that may occur at certain frequencies during the transmission from transmitter circuit 16 to receiver circuit 26. Accordingly, embodiments of CTLE 20 may be suitable for use in communication channels between ICs mounted on a PCB as well as between units implemented on an IC die. In addition, embodiments of CTLE 20 suitable for use in communication channels between units (e.g., from a peripheral component of a computer system to the computer system motherboard) are also possible and contemplated.

Figure 2:
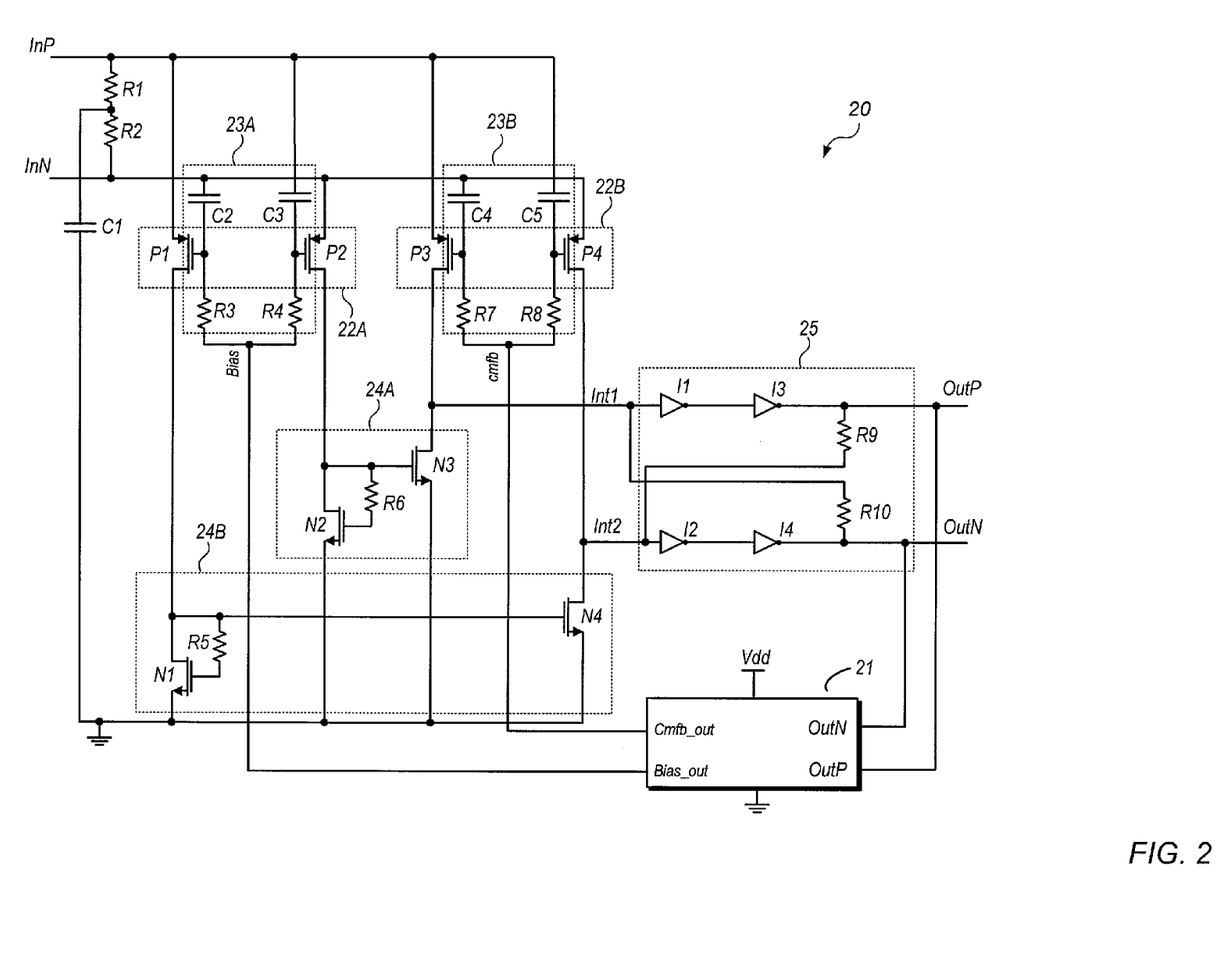
FIG. 2 is a schematic diagram of one embodiment of an equalization circuit.

CTLE Circuit:

FIG. 2 is a schematic diagram of one embodiment of an equalization circuit. In the embodiment shown, CTLE 20 includes a first differential amplifier 22A, a second differential amplifier 22B, a first differential high-pass filter 23A, and a second differential high-pass filter 23B. CTLE also includes a first current mirror 24A, a second current mirror 24B, an output circuit 25, and a bias/feedback circuit 21 in this embodiment. CTLE 20 may amplify a difference between two signals of a differential input signal using differential amplifiers 22A and 22B and the other circuitry coupled thereto. The amplified difference may be maximal at higher frequencies. Thus, in contrast to circuits relying on passive components to reduce channel loses (but provide no amplifier gain), CTLE 20 may actively compensate for channel losses that may otherwise occur at higher frequencies. Moreover, CTLE 20 may provide an amplifier gain factor that enables equalization of the frequency response of a communication channel over a frequency range from 0 Hz up to at least a frequency of interest.

It is noted that transistors designated with a 'P' in the illustrated embodiment are p-channel metal oxide semiconductor (PMOS) transistors, while transistors designated with an 'N' are n-channel metal oxide semiconductor (NMOS) transistors. Components designated with a 'C' in the illustrated embodiment are capacitors, while components designated with an 'R' are resistors. Components designated with an 'I' in the illustrated embodiment are inverters. While the embodiment of CTLE 20 in FIG. 2 has a specific circuit topology, other embodiments are possible and contemplated. For example, embodiments utilizing PMOS transistors where NMOS transistors are currently implemented, and vice versa, are possible and contemplated. Embodiments utilizing other types of transistors (e.g., bipolar transistors) are also possible and contemplated. With respect to specific component values (e.g., capacitance values of capacitors), embodiments utilizing components with fixed values and embodiments utilizing components with variable values (e.g., variable resistors and/or variable capacitors) are both possible and contemplated.

Each differential high-pass filter 23 includes a first leg and a second leg. A first leg of differential amplifier 23A includes C2 and R3, while a second leg includes C3 and R4. The first leg of differential high-pass filter 23A is coupled to the gate terminal of P1, at the junction of C2 and R3. The second leg of differential high-pass filter 23A is coupled to the gate terminal of P2, at the junction of C3 and R4. A first leg of the second differential high-pass filter 23B is coupled to a gate terminal of P3 at the junction of C4 and R7. A second leg of the second differential high-pass filter is coupled to the gate terminal of P4 at the junction of C5 and R8. Components C2, C3, R3, and R4 and their corresponding structural equivalents may be referred to as a "means for high-pass filtering a differential input signal including a first signal and a second signal" (e.g., where the first input signal is received on InP and the second input signal is received on InN). Components C4, R7, C5, and R8 and their corresponding structural equivalents may also be referred to as "means for high-pass filtering the differential input signal."

Each of the differential amplifiers 22 and differential high-pass filters 23 are coupled to receive signals via first and second inputs, InP and InN, respectively, for receiving a differential input signal. In the embodiment shown, source terminals of P1 (of differential amplifier 23A) and P3 (of differential amplifier 22B) are coupled to the first input node InP. Similarly, source terminals of P2 and P4 (of differential amplifiers 22A and 22B, respectively) are each coupled to the second input node InN. Accordingly, P1 and P3 are each coupled to receive an unfiltered input signal on their respective source terminals from input node InP. Similarly, P2 and P4 are each coupled to receive an unfiltered input signal on their respective source terminals from input node InN. Thus, in the arrangement shown, each transistor of differential amplifiers 22A and 22B is coupled to receive an unfiltered input signal on its source terminal, and a filtered signal on it gate terminal. The unfiltered and filtered signals received on the respective source and gate terminals of each transistor may have opposite polarities with respect to each other when a differential signal is received by InP and InN. Components P1, P2 and their corresponding structural equivalents may be referred to as "means for amplifying a difference between the first signal and a high-pass filtered version of the second signal (e.g., that is received from the means for high-pass filtering as referred to above) and amplifying a difference between the second signal and a high-pass filtered version of the first signal (e.g., that is received from the means for high-pass filtering referred to above)." Components P3, P4, and their structural equivalents may similarly be referred to as "means for amplifying a difference between the first signal and a high-pass filtered version of the second signal and amplifying a difference between the second signal and a high-pass filtered version of the first signal," wherein the high-pass filtered versions of the first and second signals may be received from the means for high-pass filtering referred to above.

Since the gate terminals are each coupled to receive a high-pass filtered signal, the current flowing through each of the transistors of differential amplifiers 22A and 22B is thus frequency dependent. More particularly, the current flowing through each of the transistors of differential amplifiers 22A and 22B may be greater at frequencies above the cutoff frequency of differential high-pass filters 23A and 23B, the amplification response for each differential amplifier may correspondingly be greater at high frequencies than at lower frequencies. Thus, CTLE 20 may not only reduce channel losses at frequencies above the cutoff frequency of the differential high-pass filters 22A and 22B, but may actually increase the response such that the overall channel response is equalized over a range of frequencies from 0 Hz up to a frequency of interest. The frequency of interest may be the frequency of signals conveyed on the communication channel, and may thus be used as a basis for selecting components to implement differential high-pass filters 23A and 23B.

The frequency of interest for various embodiments of CTLE 20 may provide a basis for selecting the values (i.e. resistance and capacitance values) for the components of differential high-pass filters 23A and 23B. These values may be selected to enable CTLE 20 to boost the frequency response of differential amplifiers 22A and 22 at a frequency of interest. In addition, the component values may also be selected in order to provide a guard band. It is noted that such factors may be considered in selecting values for other components in the circuit in addition to those that are part of differential high-pass filters 23A and 23B. It is further noted that in some embodiments, the component values may be fixed, while in other embodiments, the component values may be variable (or programmable).

Current passing through each of P3 and P4 may be dependent on currents mirrored through current mirrors 24A and 24B, in addition to being frequency dependent. In the embodiment shown, a drain of P1 is coupled to a drain terminal of N1, while a drain terminal of P4 is coupled to a drain terminal of N4. In addition, the gate terminal of N4 is coupled to the drain terminal of N1, with R5 being coupled between the drain and gate terminals of N1. Thus, N1 and N4 form current mirror 24B, with the current passing through P1 and N1 being mirrored through P4 and N4. Current mirror 24A in the embodiment shown is formed by N2 and N3, the drain terminals of which are coupled to drain terminals of P2 and P3, respectively, with the gate terminal of N3 being coupled to the drain terminal of N2. In addition, current mirror 24B also includes a resistor R6 coupled between the gate terminal and drain terminals of N2. The effect of resistors R5 and R6 may provide an additional boost in the amplifier response at frequencies above the cutoff frequency of the differential high-pass filters by inducing a non-zero drain-to-gate voltage that is frequency dependent for transistors N1 and N2, respectively. Components N1, N4, and R5 may be referred to as "means for mirroring a first current passing through said second means." Similarly, components N2, N3, and R6 may also be referred to as "means for mirroring a first current passing through said second means."

Output circuit 25 in the embodiment shown is coupled to current mirrors 24A and 24B as well as to differential amplifier 22B. A first intermediate node ('Int1') of output circuit 25 is coupled to the drain terminals of both P3 and N3 (of differential amplifier 22B and current mirror 24A, respectively). A second intermediate node ('Int2') of output circuit 25 is coupled to drain terminals of both P4 and N4 (of differential amplifier 22B and current mirror 24B, respectively). The voltages corresponding to the changing currents on nodes Int1 and Int2 may be input into inverters I1 and I2, respectively. In the embodiment shown, output circuit 25 includes a first pair of series-coupled inverters, I1 and I3, and a second pair of series-coupled inverters, I2 and I4. The first pair of inverters form a first output path between Int1 and OutP, while the second pair of inverters form a second output path between Int2 and OutN. The inverter pairs may effectively form push-pull stages that amplify the signals received via Int1 and Int2 in order to generate the differential output signal on nodes OutP and OutN. Components I1-I4, along with components R9 and R10, may be referred to as means for generating a differential output signal.

In this particular embodiment, output circuit 25 includes feedback resistors R9 and R10. A first feedback path is formed by resistor R9, which is coupled between OutP and Int2. A second feedback path is formed by resistor R10, which is coupled between OutN and Int1. These resistors feed back a portion of the output back to nodes Int1 and Int2. In this embodiment, the amount of feedback depends on the values of the resistors R9 and R10. Resistors R9 and R10 may be adjustable to change the amount of feedback that occurs in CTLE 20 in some embodiments. Output circuit 25 may provide the output signals from inverters I3 and I4 as full-rail digital signals. In one embodiment, inverters I3 and I4 may be implemented using complementary metal oxide semiconductor (CMOS) devices, and thus the output signals are provided as full-rail CMOS signals. In providing the output signals, output circuit 25 in the embodiment shown has made a decision on the data that was sent into CTLE 20. Since the feedback that is occurring is using digital values for feedback, the function performed by output circuit 25 may thus include performing a form of Decision Feedback Equalization (DFE). Whereas conventional implementations of circuits that perform DFE do so of a discrete nature (that is, based on a history of previously received digital signals that are re-timed using a local clock), CTLE 20 in the embodiment shown is configured to perform DFE as a continuous time process (the feedback occurs without re-timing to a clock). A method for performing DFE using CTLE 20 is discussed below.

Bias/feedback circuit 21 in the embodiment shown is configured to generate a bias current and a common mode feedback voltage used in operation of differential amplifiers 22A and 22B. Bias/feedback circuit 21 may also be referred to as "means for generating a common-mode feedback voltage and a bias current." In the embodiment shown, bias/feedback circuit 21 is configured to generate a bias current for differential amplifier 22A and a common mode feedback voltage for differential amplifier 22B. The bias current may be a fixed current in some embodiments, and may be generated using various types of current-source circuitry. Transistor-based bias generation circuits are possible and contemplated, wherein the bias current may be adjusted if necessary to compensate for variations in process, voltage, and temperature. The 'Bias_out' output of bias/feedback circuit in the embodiment shown is coupled to the 'Bias' node, i.e. the junction of R3 and R4. Resistors R3 and R4 are in turn are coupled to gate terminals of P1 and P2, respectively. Thus, bias/feedback circuit 21 may maintain a specified current value on the bias node, thereby setting the operating point for differential amplifier 22A.

The common mode feedback voltage may be output by bias/feedback circuit 21 to the junction of resistors R7 and R8. As shown in FIG. 2, bias/feedback circuit 21 is coupled to outputs OutP and OutN. Generation of the common mode feedback voltage may be performed by summing the voltages on the nodes OutP and OutN and dividing the sum by two. In one embodiment, the common mode feedback voltage may be generated using a summing amplifier and a voltage divider. The summing amplifier may be coupled to receive the voltages of OutP and OutN as inputs, and may generate the sum of these voltages. The voltage divider may be implemented, in one embodiment, as a simple resistor voltage divider having two resistors of substantially equal value. The voltage divider may be coupled to the output of the summing amplifier, and may receive the voltage output therefrom. The common mode voltage may be provided at the node corresponding to the junction of these two resistors. It is noted that other types of circuitry may be used as well. In general, any suitable circuitry capable of providing an average value of the voltages present on OutP and OutN may be used for providing the common mode feedback voltage.

The common mode feedback voltage value may be output via the 'Cmfb_out' output, and received at the common mode feedback node, which is the junction of resistors R7 and R8 in this embodiment. The operating point of differential amplifier 22B may be set based on the common mode feedback voltage. This point may vary with variations in the average of the voltages present on OutP and OutN.

CTLE 20 also includes a pair of termination resistors, R1 and R2, in the embodiment shown. These resistors may terminate the signal lines coupled to InP and InN, thereby reducing or elimination signal reflections and other types of noise that may adversely affect the information carried in the differential signal. In some embodiments, resistors R1 and R2 may be variable resistors that may be adjusted to compensate for process, voltage, and temperature variations, and may also be adjusted if the frequency of interest is changed. A decoupling capacitor C1 is coupled to the junction of R1 and R2 in this embodiment. This capacitor may further reduce common mode noise that may otherwise be present on R1 and R2 by shorting such noise to ground. Components R1 and R2 may also be referred to as "means for terminating a first signal line conveying the first signal and for terminating a second signal line conveying the second signal."

In general, various embodiments of CTLE 20 may be implemented to compensate for channel losses at higher frequencies. Communication channels utilizing an embodiment of CTLE 20 may be equalized up to at least a frequency of interest, in accordance with the frequency response of the differential high-pass filters. By actively compensating for channel losses that might otherwise occur at higher frequencies, CTLE 20 may enable communication channels to operate faster, thereby improving bandwidth.

Figure 3:
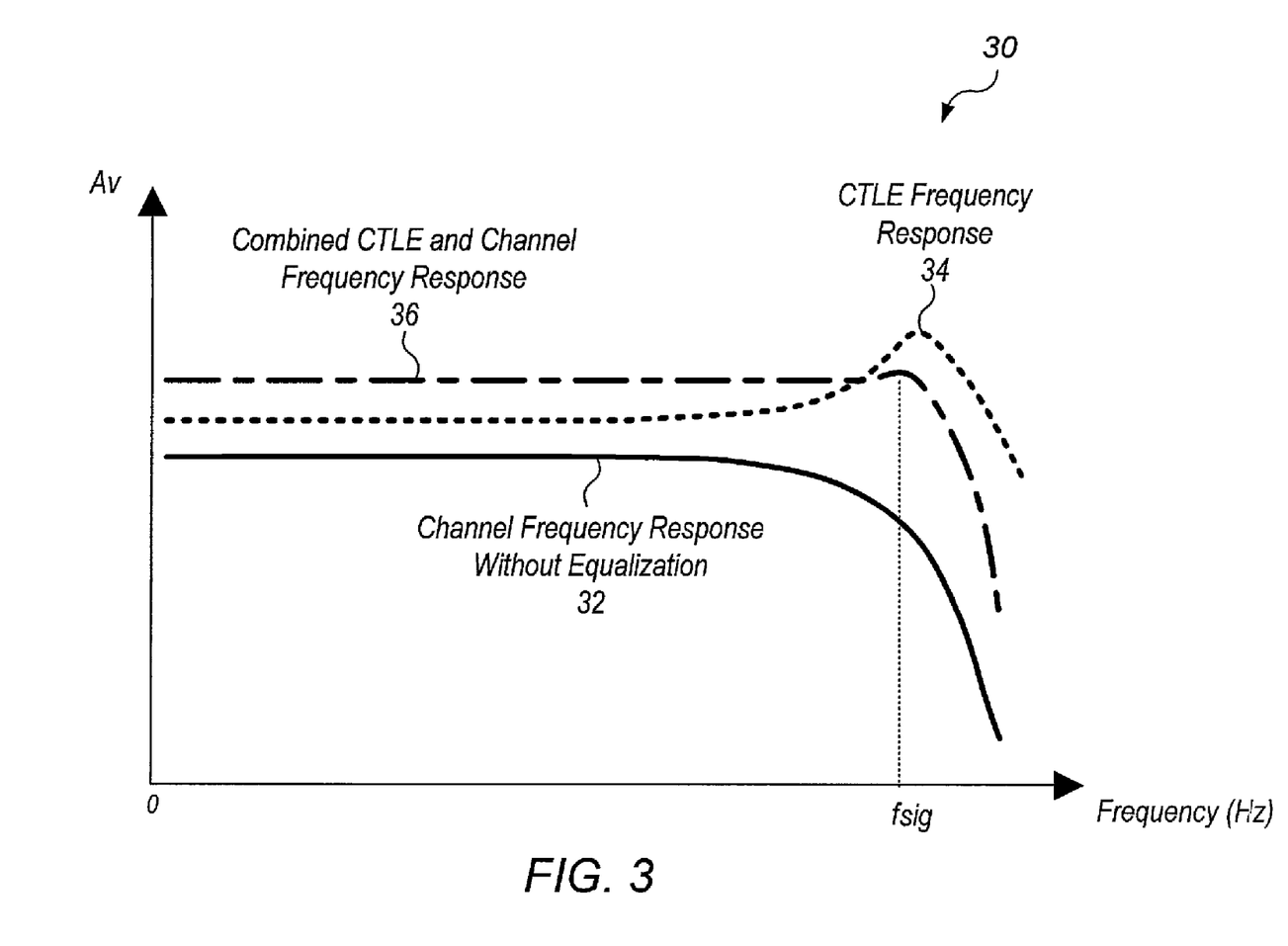
FIG. 3 is a graph illustrating respective frequency responses for various embodiments of a communication channel.

Channel Frequency Response Using CTLE Circuit:

Turning now to FIG. 3, a graph illustrating respective frequency responses for various embodiments of a communication channel. More particularly, FIG. 3 illustrates an exemplary frequency response for an uncompensated communication channel, for an embodiment of CTLE 20, and the combined response of a communication channel that includes CTLE 20. The frequency response for each of these curves extends from a frequency of 0 Hz up to a frequency of interest, fsig.

In the example shown, graph 30 includes three different curves. A first curve 32 illustrates the frequency response of an exemplary channel having no equalization. The channel response remains flat over a significant portion of the illustrated frequency range. However, at higher frequencies, the channel response declines. The decline in response may be due to losses in the transmission lines coupled between a transmitter and receiver, due to inductive impedance, signal reflections, or other factors.

A second curve 34 in the example shown illustrates the response of an exemplary CTLE over the same frequency range. At lower frequencies, the response remains flat, similar to that of the uncompensated channel. However, at the frequency of interest, the CTLE actually boosts the response to a level that is greater than at lower frequencies. This may be due to the amplification provided at the frequency of interest provided by the CTLE. In particular, the differential high-pass amplifiers may filter out lower frequency signals, while the differential amplifiers may amplify the differential signals at the high frequencies that are passed to the gate terminals of their respective transistors. While the response decreases at frequencies above the frequency of interest, the response at the frequency of interest may be sufficient to properly equalize the channel.

The third curve 36 in the example shown illustrates the combined response of a communication channel having an embodiment of a CTLE implemented therein. This response may be the product of the responses of the uncompensated channel and the CTLE itself. The channel response across the frequency spectrum remains mostly flat, with a slight boost at the frequency of interest. While the response falls above the frequency of interest, the overall channel response in this example is largely equalized across the frequency range from 0 Hz up to the frequency of interest. Thus, implementing a CTLE in the communication channel between the transmitter and receiver may improve the overall channel performance.

Figure 4:
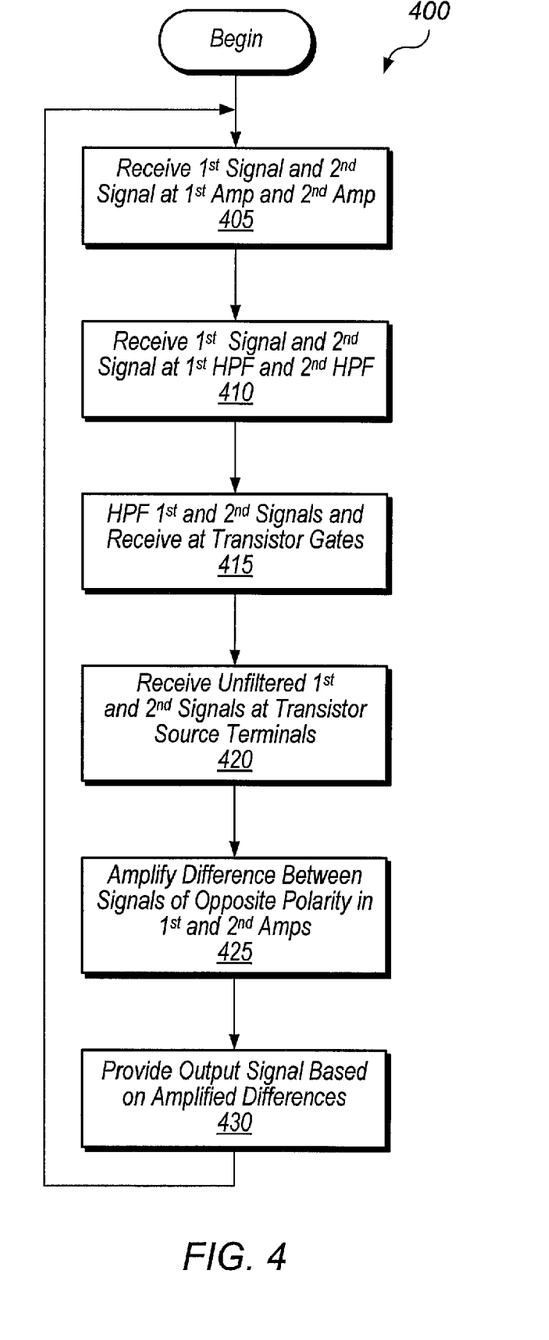
FIG. 4 is a flow diagram illustrating the operation of one embodiment of an equalization circuit.

Method for Operating CTLE Circuit:

FIG. 4 is a flow diagram illustrating the operation of one embodiment of an equalization circuit. In the embodiment shown, method 400 includes receiving a first signal and a second signal at first and second differential amplifiers (block 405). The first and second signals may be complements of one another, and may thus form a differential signal.

The complementary first and second signals that form the differential signal may also be received by differential high-pass filters (block 410). A first differential high-pass filter may be associated with the first differential amplifier, while a second differential high-pass filter may be associated with the second differential amplifier.

The filtered signals produced by the differential high-pass filters may be received on the gate terminals of the transistors that implement the first and second differential amplifiers (block 415). Unfiltered first and second signals may be received at the source terminals of the transistors (block 420). The signals received on each source terminal may be of an opposite polarity with respect to the signals received on the respective gate terminal of the same transistor. Similarly, the differential amplifiers may be arranged such that a gate terminal of a first transistor is coupled to receive a signal having a polarity opposite that of a signal received on the gate terminal of a second transistor. Accordingly, the transistors of each differential amplifier may amplifier a difference between signals of opposite polarity, and thus amplify the overall difference between the first and second signals of the differential signal (block 425).

An output signal may be provided from the CTLE based on the amplified differences (block 430). The output response may be greater at high frequencies than at lower frequencies due to the effect of the differential high-pass filters. The increased response at higher frequencies may be used to compensate for channel losses that may otherwise occur at these frequencies in a channel that is uncompensated. Accordingly, the CTLE may substantially equalize the response of the channel over a frequency spectrum from 0 Hz up to a frequency of interest that is based at least in part on the cutoff frequency of the high-pass filters. Various embodiments of CTLE 20 as discussed above in reference to FIG. 2 may be used to perform this function.

Figure 5:
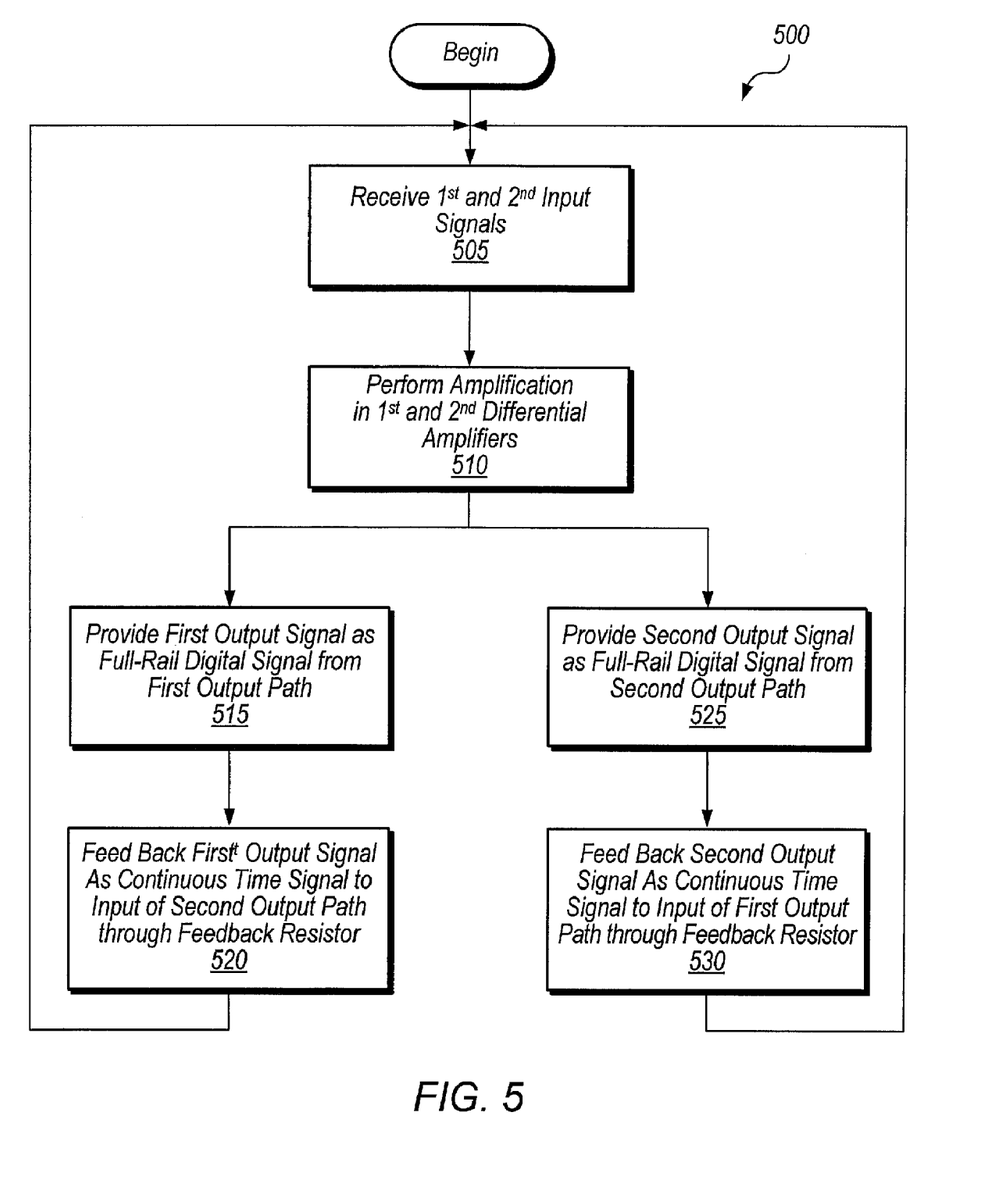
FIG. 5 is a flow diagram illustrating a method for performing decision feedback equalization (DFE) using an embodiment of an equalization circuit.

Method for Performing DFE Using CTLE Circuit:

FIG. 5 is a flow diagram illustrating one embodiment of a method for performing DFE using a CTLE circuit. DFE is commonly used in communications and other types of circuits to reduce or eliminate errors in detecting values of received digital signals that may occur due to factors such as inter-symbol interference (ISI) and other sources of noise. More particularly, DFE utilizes the history of previous decisions for previously received digital signal in order to decide a correct value for a currently received digital signal. In conventional embodiments, DFE may be performed on a discrete basis, i.e. transitions are relative to a clock. However, FIG. 5 illustrates one embodiment of a method for performing DFE on a continuous time, i.e. transitions remain unchanged based on where they occurred originally, basis using an embodiment of CTLE circuit 20 as discussed above.

In the embodiment shown, method 500 may be initiated by receiving first and second input signals (block 505). The input signals may be complementary signals that collectively form a differential input signal. Upon receipt of the first and second signals, the difference therebetween may be amplified by first and second differential amplifiers (block 510). In one embodiment, the amplification of the amplification performed by the differential amplifiers may be as described above with reference to FIG. 2 and/or FIG. 4.

The result of the amplified difference between the first and second signals may be provided as a differential signal to an output circuit having first and second output paths. A first output signal may be provided as a full-rail digital signal from a first output path (block 515). As used herein, the term "full-rail" may be defined as a signal that is provided at or substantially close to maximum and minimum voltages of a voltage swing for digital signals, e.g., at or near 1.0 volts or 0.0 volts for a digital signal having a 1-volt swing. The first full-rail output signal may be provided as a continuous time feedback signal, through a feedback resistor, to an intermediate node that serves as an input to the second output path (block 520).

Concurrent with blocks 515 and 520, a second output signal may also be provided as a full-rail digital signal from a second output path (block 525). Since the first and second output signals collectively form a differential output signal, the second output signal is a logical complement of the first output signal in this embodiment. The second full-rail output signal may be provided as feedback through another feedback resistor to another intermediate node that serves as an input to the first output path (block 530).

Since both the first and second output signals are fed back to the inputs of the complementary output paths (i.e. first output signal to second output path, second output signal to first output path) as continuous time signals, DFE may thus be performed on a continuous time basis. Performing DFE in this manner may eliminate the need for circuitry necessary to maintain a history of previous, discrete decisions made in determining the correct value for received signals that are to be amplified and provided as output signals.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

What is claimed is:

1. A circuit comprising:
   a first differential amplifier having first and second transistors;
   a first differential high-pass filter coupled to respective gate terminals of the first and second transistors, wherein a source terminal of the first transistor is coupled to a first input node, and wherein a source terminal of the second transistor is coupled to a second input node;
   a second differential amplifier having third and fourth transistors; and
   a second differential high-pass filter coupled to respective gate terminals of the third and fourth transistors, wherein a source terminal of the third transistor is coupled to the first input node, and wherein a source terminal of the fourth transistor is coupled to the second input node.

2. The circuit as recited in claim 1, wherein respective gate terminals of the first and second transistors are coupled to receive, via the first differential high-pass filter, signals having opposite polarities from the signals received at their respective source terminals; and
   wherein respective gate terminals of the third and fourth transistors are coupled to receive, via the second differential high-pass filter, signals having opposite polarities from the signals received at their respective source terminals.

3. The circuit as recited in claim 2, wherein the first differential high-pass filter includes:
   a first capacitor coupled between the gate terminal of the first transistor and the second input node;
   a second capacitor coupled between the gate terminal of the second transistor and the first input node;
   a first resistor coupled between the gate terminal of the first transistor and a bias node; and
   a second resistor coupled between the gate terminal of the second transistor and the bias node;
   wherein the second differential high-pass filter includes:
   a third capacitor coupled between the gate terminal of the third transistor and the second input node;
   a fourth capacitor coupled between the gate terminal of the fourth transistor and the first input node;
   a third resistor coupled between the gate terminal of the third transistor and a common mode feedback node; and
   a fourth resistor coupled between the gate terminal of the fourth resistor and the common mode feedback node.

4. The circuit as recited in claim 3, wherein the circuit further includes an output circuit having a first intermediate node coupled to a drain terminal of the third transistor and a second intermediate node coupled to a drain terminal of the fourth transistor, wherein the output circuit includes:
   a first plurality of inverters coupled in series between the first intermediate node and a first output node; and
   a second plurality of inverters coupled in series between the second intermediate node and a second output node.

5. The circuit as recited in claim 4, wherein the output circuit further includes a first feedback resistor coupled between the first intermediate node and the second output node, and a second feedback resistor coupled between the second intermediate node and the first output node.

6. The circuit as recited in claim 4, wherein the circuit further includes a bias/feedback circuit coupled to receive first and second output signals from the first and second output nodes, respectively, and wherein the bias/feedback circuit is further coupled to provide a bias current on the bias node and a common mode feedback voltage on the common mode feedback node.

7. The circuit as recited in claim 1, wherein the circuit further includes:
   a first current mirror having fifth and sixth transistors, wherein a drain terminal of the fifth transistor is coupled to a drain terminal of the second transistor and a drain terminal of the sixth transistor is coupled to a drain terminal of the third transistor, wherein the first current mirror further includes a first resistor coupled between gate terminals of the fifth and sixth transistors; and
   a second current mirror having seventh and eighth transistors, wherein a drain terminal of the seventh transistor is coupled to a drain terminal of the first transistor and wherein a drain terminal of the eighth transistor is coupled to a drain terminal of the fourth transistor, and wherein the second current mirror further includes a second resistor coupled between gate terminals of the seventh and eighth transistors.

8. The circuit as recited in claim 7, further comprising a first termination resistor coupled to the first input node, and a second termination resistor coupled between the first termination resistor and the second input node.

9. The circuit as recited in claim 8, further comprising a decoupling capacitor coupled between a junction of the first and second termination resistors and a ground node.

10. A method comprising:
receiving a first signal at both a source terminal a first transistor of a first differential amplifier and at a source terminal of a third transistor of a second differential amplifier;
receiving a second signal at both a source terminal of a second transistor of the first differential amplifier and at a source terminal of a fourth transistor of the second differential amplifier;
high-pass filtering, in first and second differential high-pass filters, the first signal to generate filtered versions of the first signal at respective gate terminals of the second and fourth transistors;
high-pass filtering, in the first and second differential high-pass filters, the second signal to generate filtered versions of the second signal at respective gate terminals of the first and third transistors;
amplifying, in each of the first and second differential amplifiers, a difference between filtered versions of the first and second signals; and
generating a differential output signal based on said amplifying.

11. The method as recited in claim 10, wherein generating the differential output signal comprises:
a first plurality of serially-coupled inverters receiving a third signal from a drain terminal of the third transistor;
a second plurality of serially-coupled inverters receiving a fourth signal from a drain terminal of the fourth transistor;
the first plurality of serially-coupled inverters generating a first output signal based on the third signal; and
the second plurality of serially-coupled inverters generating a second output signal based on the fourth signal, the second output signal having a polarity opposite of the first output signal, wherein the differential output signal comprises the first and second output signals.

12. The method as recited in claim 11, further comprising:
a first current mirror mirroring current passing through a drain terminal of the second transistor, wherein the first current mirror includes a fifth transistor having a drain terminal coupled to the drain terminal of the second transistor, and a sixth transistor coupled to the drain terminal of the third transistor; and
a second current mirror mirroring current passing through a drain terminal of the first transistor, wherein the second current mirror includes a seventh transistor having a drain terminal coupled to the drain terminal of the first transistor, and an eighth transistor having a drain terminal coupled to the drain terminal of the fourth transistor.

13. The method as recited claim 11, further comprising:
a bias/feedback circuit receiving the first and second output signals;
the bias/feedback circuit generating a common mode feedback voltage based on the first and second output signals; and
the bias/feedback circuit further generating a bias voltage.

14. The method as recited in claim 13, further comprising the first differential high-pass filter receiving the bias voltage and the second differential high-pass filter receiving the common mode feedback voltage.

15. The method as recited in claim 11, further comprising:
providing the first output signal as feedback, through a first feedback resistor, to an input of the second plurality of serially-coupled inverters; and
providing the second output signal as feedback, through a second feedback resistor, to an input of the first plurality of serially-coupled inverters.

16. An apparatus comprising:
first means for high-pass filtering a differential input signal including a first signal and a second signal;
second means for amplifying a difference between the first signal and a high-pass filtered version of the second signal received from said first means and for amplifying a difference between the second signal and a high-pass filtered version of the first signal received from said first means;
third means for high-pass filtering the differential input signal; and
fourth means for amplifying a difference between the first signal and a high-pass filtered version of the second signal received from said third means and for amplifying a difference between the second signal and a high-pass filtered version of the first signal received from said third means.

17. The apparatus as recited in claim 16, wherein the apparatus further includes fifth means for generating a differential output signal based on said amplifying performed by said second means and said amplifying performed by said fourth means.

18. The apparatus as recited in claim 17, further comprising:
sixth means for mirroring a first current passing through said second means, wherein said sixth means is coupled between said second means and said fourth means; and
seventh means for mirroring a second current passing through said second means, wherein said seventh means is coupled between said second means and said fourth means.

19. The apparatus as recited in claim 18, further comprising eighth means for generating a common-mode feedback voltage and a bias current, wherein said eighth means is coupled to provide the common-mode feedback voltage to said third means, and further coupled to provide the bias current to said first means.

20. The apparatus as recited in claim 19, further comprising ninth means for terminating a first signal line conveying the first signal and for terminating a second signal line conveying the second signal.

21. A method comprising:
receiving first and second signals;
amplifying, in first and second differential amplifiers, a difference between filtered versions of the first and second signals;
generating, based on said amplifying, a differential output having first and second full-rail digital output signals on first and second output paths, respectively;
providing the first full-rail digital output signal as continuous time feedback to an input of the second output path; and
providing the second full-rail digital output signal as continuous time feedback to an input of the first output path.

22. The method as recited in claim 21, further comprising providing the first full-rail digital output signal to the input of the second output path through a first feedback resistor, and providing the second full-rail digital output signal to the input of the first output path through a second feedback resistor.

23. The method as recited in claim 21, further comprising wherein the filtered versions of the first and second signals are provided by high-pass filtering the first and second signals.

24. The method as recited in claim 23, further comprising:
receiving a high-pass filtered version of the first signal at a gate terminal of a first transistor and the second signal at a source terminal of the first transistor;
receiving a high-pass filtered version of the second signal at a gate terminal of a second transistor and the first signal at a source terminal of the second transistor, wherein the first differential amplifier includes the first and second transistors;
receiving another high-pass filtered version of the first signal at a gate terminal of a third transistor and the second signal at a source terminal of the third transistor; and
receiving another high-pass filtered version of the second signal at a gate terminal of a fourth transistor and the first signal at a source terminal of the fourth transistor, wherein the second differential amplifier includes the third and fourth transistors.

* * * * *